(12) United States Patent
Ishikawa et al.

(10) Patent No.: US 7,582,220 B1
(45) Date of Patent: Sep. 1, 2009

(54) ETCHING METHOD

(75) Inventors: Mitsuru Ishikawa, Yamanashi (JP);
Masaaki Hagihara, Beverly, MA (US);
Koichiro Inazawa, Yamanashi (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/696,232

(22) Filed: Oct. 26, 2000

(30) Foreign Application Priority Data

Oct. 26, 1999 (JP) ................................. 11-303422

(51) Int. Cl.
*H01L 21/301* (2006.01)
(52) U.S. Cl. .................... 216/67; 252/79.1; 438/689
(58) Field of Classification Search .................. None
See application file for complete search history.

(56) References Cited

U.S. PATENT DOCUMENTS

| | | | | |
|---|---|---|---|---|
| 4,946,549 A | * | 8/1990 | Bachman et al. | 216/69 |
| 4,976,818 A | * | 12/1990 | Hashimoto et al. | 438/703 |
| 5,038,713 A | * | 8/1991 | Kawakami et al. | 118/723 MA |
| 5,173,151 A | * | 12/1992 | Namose | 438/699 |
| 5,204,276 A | * | 4/1993 | Nakajima et al. | 438/366 |
| 5,262,358 A | * | 11/1993 | Sigmund et al. | 438/781 |
| 5,522,957 A | * | 6/1996 | Weling et al. | 438/694 |
| 5,604,380 A | * | 2/1997 | Nishimura et al. | 257/758 |
| 5,605,600 A | * | 2/1997 | Muller et al. | 438/695 |
| 5,654,233 A | * | 8/1997 | Yu | 438/643 |
| 5,658,425 A | * | 8/1997 | Halman et al. | 438/620 |
| 5,721,156 A | * | 2/1998 | Matsuura | 438/699 |
| 5,776,828 A | * | 7/1998 | Givens | 438/631 |
| 5,801,094 A | * | 9/1998 | Yew et al. | 438/624 |
| 5,835,987 A | * | 11/1998 | Givens | 257/522 |
| 5,990,015 A | * | 11/1999 | Lin et al. | 438/706 |
| 6,013,547 A | * | 1/2000 | Liaw | 438/238 |

(Continued)

FOREIGN PATENT DOCUMENTS

EP  0 790 645 A2 * 8/1997

(Continued)

OTHER PUBLICATIONS

Office Action issued by the Japanese Patent Office in a corresponding Japanese patent application on Oct. 7, 2008.

*Primary Examiner*—Allan Olsen
(74) *Attorney, Agent, or Firm*—Finnegan, Henderson, Farabow, Garrett & Dunner, L.L.P.

(57) ABSTRACT

In an etching method for etching an etching target film formed on a substrate placed inside an airtight processing chamber 104 by inducing a processing gas into the processing chamber 104, the processing gas contains $CF_4$, $N_2$ and Ar and the etching target film is constituted of an upper organic polysiloxane film and a lower inorganic $SiO_2$ film. The flow rate ratio of $CF_4$ and $N_2$ in the processing gas is essentially set within a range of $1 \leq (N_2$ flow rate/$CF_4$ flow rate$) \leq 4$. If ($N_2$ flow rate/$CF_4$ flow rate) is less than 1, an etching stop occurs and, as a result, deep etching is not achieved. If, on the other hand, ($N_2$ flow rate/$CF_4$ flow rate) is larger than 4, bowing tends to occur and, thus, a good etching shape is not achieved. Accordingly, the flow rate ratio of $CF_4$ and $N_2$ in the processing gas should be set essentially within a range of $1 \leq (N_2$ flow rate/$CF_4$ flow rate$) \leq 4$, to ensure that improvements in both the selection ratio and the etching shape are achieved.

5 Claims, 3 Drawing Sheets

U.S. PATENT DOCUMENTS

| | | | | |
|---|---|---|---|---|
| 6,014,979 | A * | 1/2000 | Van Autryve et al. | 134/1.1 |
| 6,033,979 | A * | 3/2000 | Endo | 438/622 |
| 6,040,223 | A * | 3/2000 | Liu et al. | 438/303 |
| 6,060,400 | A * | 5/2000 | Oehrlein et al. | 438/706 |
| 6,107,155 | A * | 8/2000 | Hsiao et al. | 438/397 |
| 6,136,211 | A * | 10/2000 | Qian et al. | 216/37 |
| 6,140,222 | A * | 10/2000 | Bollinger et al. | 438/623 |
| 6,143,665 | A * | 11/2000 | Hsieh | 438/710 |
| 6,159,661 | A * | 12/2000 | Huang et al. | 430/313 |
| 6,163,407 | A * | 12/2000 | Okazaki et al. | 359/619 |
| 6,168,726 | B1 * | 1/2001 | Li et al. | 216/79 |
| 6,177,329 | B1 * | 1/2001 | Pang | 438/400 |
| 6,180,518 | B1 * | 1/2001 | Layadi et al. | 438/639 |
| 6,180,975 | B1 * | 1/2001 | Radens et al. | 257/306 |
| 6,211,035 | B1 * | 4/2001 | Moise et al. | 438/396 |
| 6,211,051 | B1 * | 4/2001 | Jurgensen et al. | 438/597 |
| 6,211,061 | B1 * | 4/2001 | Chen et al. | 438/622 |
| 6,221,745 | B1 * | 4/2001 | Fan | 438/592 |
| 6,235,453 | B1 * | 5/2001 | You et al. | 430/329 |
| 6,245,489 | B1 * | 6/2001 | Baklanov et al. | 430/313 |
| 6,255,180 | B1 * | 7/2001 | Smith | 438/301 |
| 6,284,149 | B1 * | 9/2001 | Li et al. | 216/64 |
| 6,316,160 | B1 * | 11/2001 | Shao et al. | 430/271.1 |
| 6,316,351 | B1 * | 11/2001 | Chen et al. | 438/638 |
| 6,319,815 | B1 * | 11/2001 | Iguchi et al. | 438/624 |
| 6,325,861 | B1 * | 12/2001 | Stinnett | 134/2 |
| 6,326,307 | B1 * | 12/2001 | Lindley et al. | 438/689 |
| 6,331,380 | B1 * | 12/2001 | Ye et al. | 430/318 |
| 6,355,567 | B1 * | 3/2002 | Halle et al. | 438/700 |
| 6,355,572 | B1 * | 3/2002 | Ikegami | 438/706 |
| 6,376,386 | B1 * | 4/2002 | Oshima | 438/714 |
| 6,410,437 | B1 * | 6/2002 | Flanner et al. | 438/689 |
| 6,440,864 | B1 * | 8/2002 | Kropewnicki et al. | 438/710 |
| 6,455,411 | B1 * | 9/2002 | Jiang et al. | 438/624 |
| 6,461,962 | B1 * | 10/2002 | Adachi et al. | 438/689 |
| 6,472,317 | B1 * | 10/2002 | Wang et al. | 438/638 |
| 6,472,717 | B1 * | 10/2002 | Jeng et al. | 257/410 |
| 6,475,918 | B1 * | 11/2002 | Izawa et al. | 438/714 |
| 6,506,680 | B1 * | 1/2003 | Kim et al. | 438/692 |
| 6,565,763 | B1 * | 5/2003 | Asakawa et al. | 216/56 |
| 6,570,257 | B2 * | 5/2003 | Chen et al. | 257/762 |
| 6,573,196 | B1 * | 6/2003 | Gaillard et al. | 438/789 |
| 6,617,253 | B1 * | 9/2003 | Chu et al. | 438/702 |
| 6,686,296 | B1 * | 2/2004 | Costrini et al. | 438/725 |
| 6,720,249 | B1 * | 4/2004 | Liu et al. | 438/624 |
| 6,872,665 | B1 * | 3/2005 | Celii et al. | 438/700 |
| 7,419,902 | B2 | 9/2008 | Uno et al. | |
| 2001/0010970 | A1 * | 8/2001 | Uglow et al. | 438/622 |
| 2001/0026952 | A1 * | 10/2001 | Engelhardt | 438/100 |
| 2001/0027016 | A1 * | 10/2001 | Han et al. | 438/689 |
| 2002/0058362 | A1 * | 5/2002 | Ohtani et al. | 438/151 |
| 2002/0074309 | A1 * | 6/2002 | Bjorkman et al. | 216/13 |
| 2002/0195419 | A1 * | 12/2002 | Pavelchek | 216/16 |
| 2005/0079717 | A1 * | 4/2005 | Savas et al. | 438/689 |
| 2005/0090634 | A1 * | 4/2005 | Morse et al. | 528/12 |

FOREIGN PATENT DOCUMENTS

| | | |
|---|---|---|
| JP | 10-268526 | 10/1998 |
| JP | 2001-068455 | 3/2001 |

* cited by examiner (A)Central Area (B)Edge

Implementation Example 1 (a)

X (C)Central Area (D)Edge

Implementation Example 1 (b)

(E)Central Area (F)Edge

Implementation Example 1 (c)

Implementation
Example 2
(a)

(A)Central Area    (B)Edge

Implementation
Example 2
(b)

(C)Central Area    (D)Edge

ETCHING METHOD

BACKGROUND OF INVENTION

1. Field of the Invention

The present invention relates to an etching method

2. Description of the Related Art

Reflecting the ever-increasing need for the miniaturization of the wiring structure, organic materials achieving low dielectric constants compared to the dielectric constant of $SiO_2$ used in the prior art have come to be utilized to constitute a layer insulating film (a film undergoing an etching process) on a Si substrate in the semiconductor manufacturing technology in recent years. Such organic materials with low dielectric constants include, for instance, polyorganosiloxane bridge-formation benzo cyclobutene resin (BCB), SILK (product name) manufactured by Dow Chemicals and FLARE (product name) manufactured by AlliedSignal Incorporated.

Conventionally, $CF_4$ containing a great quantity of fluorine atoms is used as the etching gas in a dry etching process for forming grooves such as contact holes in an organic material with a low dielectric constant in order to form a reactive seed containing fluorine through plasma discharge or the like, and the processing gas is prepared by mixing in Ar which is mainly used to achieve gas flow rate ratio control and $O_2$ which is mainly used to achieve an improvement in the penetration, i.e., to promote etching along the depthwise direction.

However, a first problem that should be noted occurring when using the mixed gas containing $CF_4$, $O_2$ and Ar as the processing gas to etch a film constituted of an organic material with a low dielectric constant is a low resist-relative selection ratio. The resist-relative selection ratio in this context refers to the value expressed as (average etching rate of the etching target film)/(etching rate of the photoresist) and hereafter it is simply referred to as the "selection ratio." The use of a processing gas with a low selection ratio will result in a wider groove opening and, therefore, is not desirable. It also poses a second problem in that the etching shape is adversely affected by bowing.

SUMMARY OF THE INVENTION

An object of that present invention, which has been completed by addressing the problems of the etching method in the prior art discussed above, is to provide a new and improved etching method through which an improvement in the selection ratio and an improvement in the etching shape can be achieved.

In order to achieve the object described above, in a first aspect of the present invention, an etching method for etching an etching target film formed on a substrate placed inside an airtight processing chamber by inducing a processing gas into the processing chamber, in which the processing gas contains at least $CF_4$ and $N_2$ and the etching target film is constituted of an upper organic film containing Si and a lower $SiO_2$ film, is provided. It is to be noted that the processing gas may further contain Ar.

The organic film containing Si (the upper layer film) may be constituted of $SiO_2$ containing C and H, for instance. In addition, the dielectric constant of the organic film containing Si may be set equal to or lower than 3.0, for instance. The organic film containing Si may be constituted of organic polysiloxane, for instance. Organic polysiloxane as referred to in this context is a substance having an $SiO_2$ bond structure containing a functional group that, in turn, contains C and H, as expressed in the following chemical formula. It is to be noted that in the following chemical formula, the letter R indicates an alkyl group such as a methyl group, an ethyl group or a propyl group or an alkyl group derivative or an allyl group such as a phenyl group or its derivative.

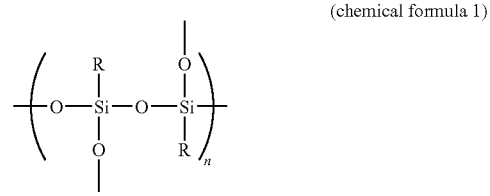

(chemical formula 1)

By adopting this etching method, improvements in the selection ratio and in the etching shape can be achieved. For instance, while the selection ratio achieved by using the mixed gas containing $CF_4$, $O_2$ and Ar as a processing gas, as in the prior art, is approximately 2.0, a selection ratio of approximately 5.8 is achieved by using a mixed gas containing $CF_4$, $N_2$ and Ar as described above as the processing gas.

In addition, if the flow rate ratio of $CF_4$ and $N_2$ ($N_2$ flow rate/$CF_4$ flow rate) in the processing gas is less than 1, an etching stop occurs and, as a result, deep etching cannot be achieved. If, on the other hand, ($N_2$ flow rate/$CF_4$ flow rate) is larger than 4, bowing tends to occur readily and thus, a good etching shape is not achieved. Accordingly, it is desirable to set the flow rate ratio of $CF_4$ and $N_2$ in the processing gas essentially within a range of $1 \leq (N_2$ flow rate/$CF_4$ flow rate$) \leq 4$.

Furthermore, in order to achieve the object described above, in a second aspect of the present invention, an etching method for etching an etching target film formed on a substrate placed inside an airtight processing chamber by inducing a processing gas into the processing chamber, in which the processing gas contains at least $C_4F_8$ and $N_2$ and the etching target is constituted of an upper organic film containing Si and a lower SiN film, is provided.

The organic film containing Si (the upper layer film) may be constituted of $SiO_2$ containing C and H, for instance. In addition, the dielectric constant of the organic film containing Si may be set equal to or lower than 3.0, for instance. The organic film containing Si may be constituted of organic polysiloxane, for instance.

When the lower layer of the etching target film is constituted of an SiN film, a better selection ratio is achieved by using a mixed gas containing $C_4F_8$ and $N_2$ as described above or by using a mixed gas containing $C_4F_8$, $N_2$ and Ar, rather than by using a mixed gas containing $CF_4$ and $N_2$ or a mixed gas containing $CF_4$, $N_2$ and Ar.

In addition, if the flow rate ratio of $C_4F_8$ and $N_2$ ($N_2$ flow rate/$C_4F_8$ flow rate) in the processing gas is less than 10, an etching stop occurs and, as a result, deep etching is not achieved. Accordingly, it is desirable to set the flow rate ratio of $C_4F_8$ and $N_2$ in the processing gas essentially within a range of $10 \leq (N_2$ flow rate/$C_4F_8$ flow rate$)$.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE PREFERRED EMBODIMENTS

The following is a detailed explanation of preferred embodiments of the etching method according to the present invention, given in reference to the attached drawings. It is to noted that in the specification and the drawings, the same reference numbers are assigned to components having essentially identical functions and structural features, to preclude the necessity for repeated explanation thereof.

(First Embodiment)

(1) Structure of the Etching Apparatus

Figure 1:
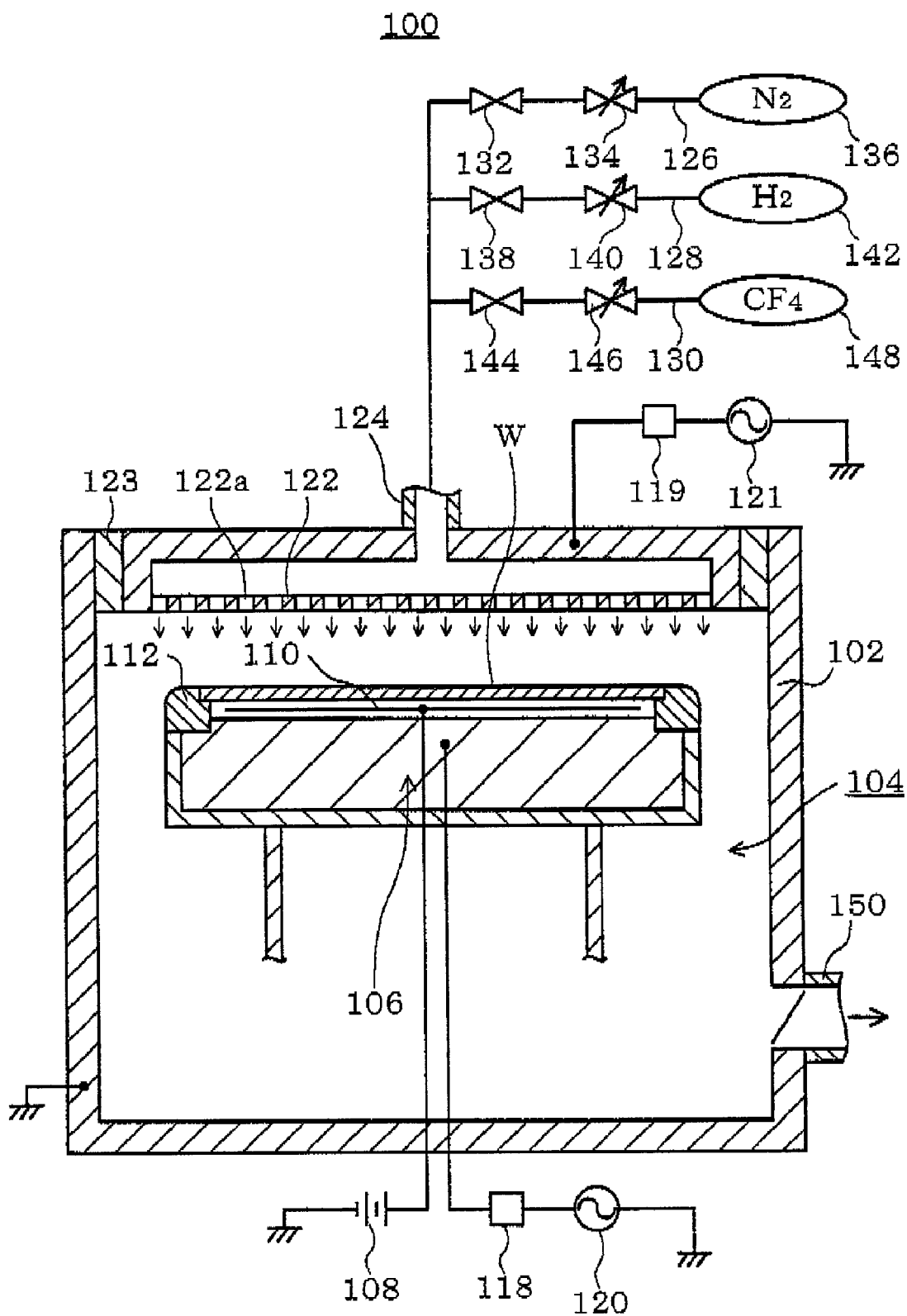
FIG. 1 is a sectional view schematically illustrating an etching apparatus which may adopt the present invention.

First, in reference to FIG. 1, an etching apparatus 100 in which the etching method in the embodiment is adopted is explained.

A processing chamber 104 is formed inside a processing container 102 which is grounded for safety in the etching apparatus 100 in the figure, and inside the processing chamber 104, a lower electrode 106 constituting a susceptor capable of traveling freely along the vertical direction is provided. An electrostatic chuck 110 connected to a high-voltage DC source 108 is provided at the top of the lower electrode 106, and a workpiece, e.g., a semiconductor wafer (hereafter referred to as a "wafer") W is placed on the upper surface of the electrostatic chuck 110. In addition, a focus ring 112 having an insulating property is provided around the wafer W placed on the lower electrode 106. A high-frequency source 120 is connected to the lower electrode 106 via a matcher 118.

At the ceiling of the processing chamber 104 facing opposite the mounting surface of the lower electrode 106, an upper electrode 122 having numerous gas outlet holes 122a is provided. An insulator 123 is provided between the upper electrode 122 and the processing container 102. In addition, a high-frequency source 121 which outputs plasma-generating high-frequency power is connected to the upper electrode 122 via a matcher 119. A gas supply pipe 124 is connected to the gas outlet holes 122a, with first~third branch pipes 126, 128 and 130 connected to the gas supply pipe 124 in the example presented in the figure.

A gas supply source 136 which supplies $CF_4$ is connected to the first branch pipe 126 via a switching valve 132 and a flow-regulating valve 134. A gas supply source 142 that supplies $N_2$ is connected to the second branch pipe 128 via a switching valve 138 and a flow-regulating valve 140. In addition, a gas supply source 148 that supplies Ar is connected to the third branch pipe 130 via a switching valve 144 and a flow-regulating valve 146. It is to be noted that the inert gas added into the processing gas does not need to be Ar, and any inert gas such as He or Kr may be used as long as the inert gas can be used to adjust the plasma excited inside the processing chamber 104.

Near the bottom of the processing container 102, an evacuating pipe 150 which communicates with a vacuum drawing mechanism (not shown) is connected, and by engaging the vacuum drawing mechanism in operation, the atmosphere inside the processing chamber 104 is sustained at a specific reduced pressure.

(2) Structure of the Wafer

Next, the structure of the wafer W undergoing the etching process through the etching method in the embodiment is explained.

At the wafer W used in the embodiment, an $SiO_2$ film (having a dielectric constant of approximately 4.0) to function as an etching stopper for stopping the etching process at a specific depth and also as a protective film that protects the wiring formed on the Si substrate is formed on the Si (silicon) substrate. Above the $SiO_2$ film, an organic polysiloxane film is formed. In other words, the etching target film in the embodiment is constituted of the organic polysiloxane film.

It is to be noted that the organic polysiloxane film constituting the upper layer simply represents an example, and the etching target film may be an organic film mainly containing Si, O, R(C and H). For example, the etching target film may be an $SiO_2$ film containing C and H. More generally, the etching target film may be an organic film containing Si. In addition, while the organic polysiloxane film achieves a dielectric constant of 2.5~2.7, the etching target film may be, in more general terms, an organic film having a dielectric constant of 3.0 or lower.

An etching mask having a specific pattern is formed on the etching target film. This etching mask may be a mask constituted of, for instance, a photoresist film layer.

Now, the etching process implemented to form contact holes at the wafer W through the etching method in the embodiment by utilizing the etching apparatus 100 described earlier is explained.

First, the wafer W is placed on the lower electrode 106, the temperature of which has been adjusted to a specific level in advance. In addition, vacuum drawing is implemented inside the processing chamber 104 to ensure that the atmosphere inside the processing chamber 104 achieves a specific pressure suitable for the processing, e.g., approximately 20 mTorr (2.67 Pa).

Next, the processing gas in the embodiment, i.e., the processing gas achieved by mixing $CF_4$, $N_2$ and Ar, is induced into the processing chamber 104 by adjusting the flow rates of the individual gases through the flow-regulating valves 134, 140 and 146 inserted at the gas supply pipe 124. During this process, the gas flow rates are adjusted so as to achieve a flow rate ratio within a range of $1 \leq (N_2 \text{ flow rate}/CF_4 \text{ flow rate}) \leq 4$ in the processing gas. For instance, the flow rates of $N_2$, $CF_4$ and Ar may be adjusted at approximately 100 sccm, 50 sccm and 300 sccm respectively.

Then, high-frequency power having a frequency of 2 MHz and achieving a power level of approximately 1200 W, for instance, is applied to the lower electrode 106. In addition, high-frequency power having a frequency of approximately 60 MHz and achieving a power level of approximately 1500 W, for instance, is applied to the upper electrode 122. As a result, high-density plasma is generated inside the processing chamber 104, and this plasma forms contact holes achieving a specific shape at the etching target film formed at the wafer W.

By adopting the embodiment described above, improvements in the selection ratio and the etching shape are achieved. For instance, while a selection ratio of approximately 2.0 is achieved in conjunction with the mixed gas containing $CF_4$, $O_2$ and Ar used as the processing gas in the prior art, a selection ratio of approximately 5.8 is achieved by using the mixed gas containing $CF_4$, $N_2$, and Ar as the processing gas as described above.

In addition, if ($N_2$ flow rate/$CF_4$ flow rate) is less than 1, an etching stop occurs and, thus, deep etching cannot be achieved, whereas if ($N_2$ flow rate/$CF_4$ flow rate) is larger than 4, bowing tends to occur to result in a poor etching shape. However, since the flow rate ratio of $CF_4$ and $N_2$ in the processing gas is set essentially within a range of $1 \leq (N_2 \text{ flow rate}/CF_4 \text{ flow rate}) \leq 4$ in the embodiment, an etching stop is prevented and, at the same time, a better etching shape is achieved.

(Second Embodiment)

In the etching method in the first embodiment described above, a mixed gas containing $CF_4$, $N_2$ and Ar is utilized as the processing gas. In this embodiment, a mixed gas containing $C_4F_8$, $N_2$ and Ar is used as the processing gas. The following is a detailed explanation of the second embodiment, given by clarifying the difference from the first embodiment.

While the etching apparatus in which the etching method in the second embodiment is adopted is essentially similar to the etching apparatus 100, a gas supply source 136 that supplies $C_4F_8$ is connected to the first branch pipe 126 via the switching valve 132 and the flow-regulating valve 134. Thus, the mixed gas containing $C_4F_8$, $N_2$ and Ar is utilized as the processing gas in the embodiment.

Next, the structure of the wafer W to undergo the etching process through the etching method in the embodiment is explained.

At the wafer W used in the embodiment, an SiN film to function as an etching stopper for stopping the etching process at a specific depth and also as a protective film that protects the wiring formed on an Si substrate is formed on the Si (silicon) substrate. This is a structural feature which differentiates the second embodiment from the first embodiment. In addition, at the top of the SiN film, an organic polysiloxane film is formed. In other words, the etching target film in the embodiment is constituted of the organic polysiloxane film.

In this embodiment, too, the organic polysiloxane film constituting the upper layer simply represents an example, and the etching target film may be an $SiO_2$ film containing C and H. More generally, the etching target film may be an organic film containing Si. In addition, while the organic polysiloxane film achieves a dielectric constant of 2.5~2.7, the etching target film may be, in more general terms, an organic film having a dielectric constant of 3.0 or lower.

An etching mask having a specific pattern is formed on the etching target film. This etching mask may be a mask constituted of, for instance, a photoresist film layer, as in the first embodiment.

Now, the etching process implemented to form contact holes at the wafer W through the etching method in the embodiment is explained.

First, the wafer W is placed on the lower electrode 106, the temperature of which has been adjusted to a specific level in advance. In addition, vacuum drawing is implemented inside the processing chamber 104 to ensure that the atmosphere inside the processing chamber 104 achieves a specific pressure suitable for the processing, e.g., approximately 20 mTorr (2.67 Pa), as in the first embodiment.

Next, the processing gas in the embodiment, i.e., the processing gas achieved by mixing $C_4F_8$, $N_2$ and Ar, is induced into the processing chamber 104 by adjusting the flow rates of the individual gases through the flow-regulating valves 134, 140 and 146 inserted at the gas supply pipe 124. During this process, the gas flow rates are adjusted so as to achieve a flow rate ratio within a range of $10 \leq (N_2$ flow rate/$C_4F_8$ flow rate) in the processing gas. For instance, the flow rates of $N_2$, $C_4F_8$ and Ar may be adjusted at approximately 200 sccm, 12 sccm and 300 sccm respectively.

Then, high-frequency power having a frequency of 13.56 MHz and achieving a power level of approximately 1200 W, for instance, is applied to the lower electrode 106. In addition, high-frequency power having a frequency of approximately 60 MHz and achieving a power level of approximately 1500 W, for instance, is applied to the upper electrode 122. As a result, high-density plasma is generated inside the processing chamber 104, and this plasma forms contact holes achieving a specific shape at the etching target film formed at the wafer W, as in the first embodiment.

When the lower layer of the etching target film is constituted of an SiN film as in this embodiment, a better selection ratio is achieved by using the mixed gas containing $C_4F_8$, $N_2$ and Ar rather than by using a mixed gas containing $CF_4$, $N_2$ and Ar.

In addition, while if ($N_2$ flow rate/$C_4F_8$ flow rate) is less than 10, an etching stop occurs and, therefore, deep etching cannot be achieved, the flow rate ratio of $C_4F_8$ and $N_2$ in the processing gas is essentially set within a range of $10 \leq (N_2$ flow rate/$C_4F_8$ flow rate) in the embodiment, to prevent such an etching stop from occurring.

(Implementation Examples)

Figure 2:
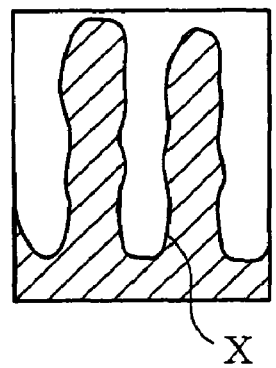
FIG. 2 schematically illustrates implementation examples 1 of the present invention.
Figure 2:
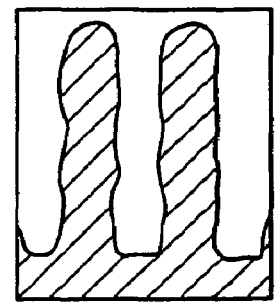
Figure 2:
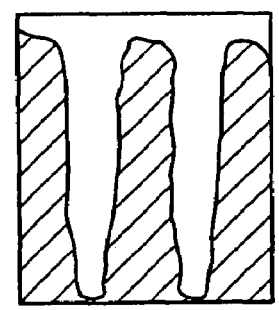
Figure 2:
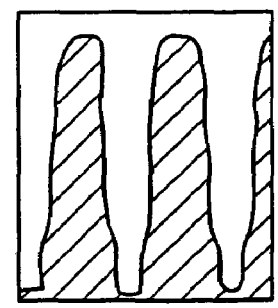
Figure 2:
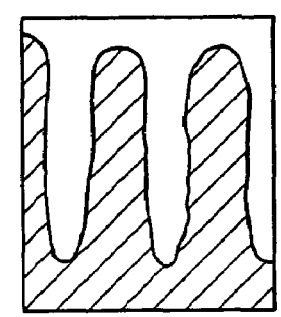
Figure 2:
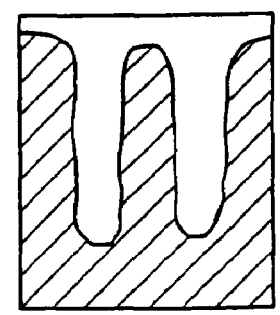
Figure 3:
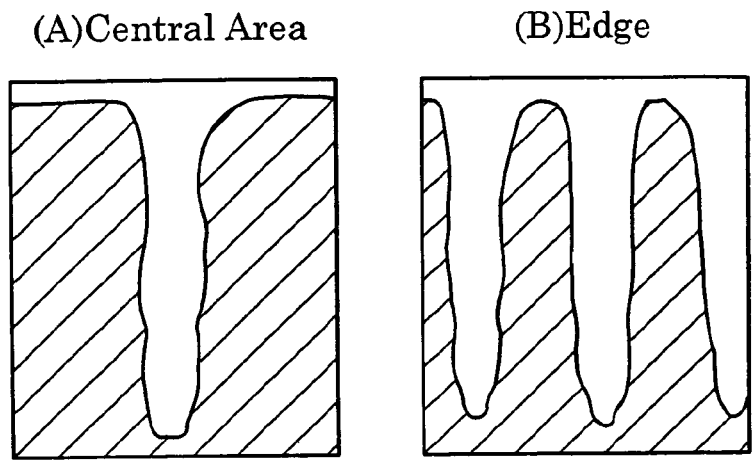
FIG. 3 schematically illustrates implementation examples 2 of the present invention.
Figure 3:
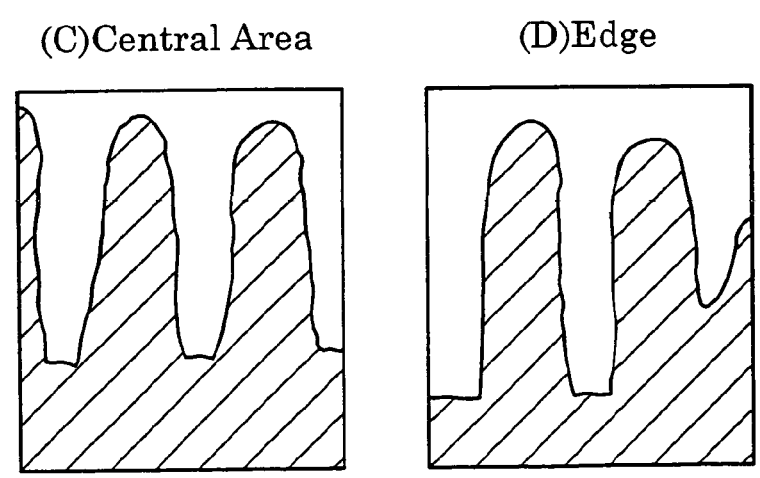

Next, examples of implementation of the etching method according to the present invention are explained in reference to FIG. 2 and FIG. 3. It is to be noted that in the implementation examples, contact holes are formed at the etching target film at the wafer W by employing the etching apparatus 100 explained in reference to the embodiments, and therefore, the same reference numbers are assigned to components having roughly identical functions and structural features to those in the etching apparatus 100 and the wafer W explained earlier, to preclude the necessity for repeated explanation thereof. In addition, the etching process conditions are set roughly the same as those in the embodiments. It is to be noted that organic polysiloxane constituting the upper layer of the etching target film achieves the following structure.

(chemical formula 2)

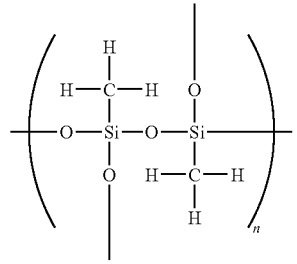

(A) Implementation examples 1 (changes in the flow rate ratio of $CF_4$ and $N_2$)

In these implementation examples, the processing gas is constituted of a mixed gas containing $CF_4$, $N_2$ and Ar and the flow rate ratio of $CF_4$ and $N_2$ is varied.

In implementation examples 1(a)~(c), an etching process is implemented by adjusting the flow rate ratio of $CF_4$, $N_2$ and Ar, respectively at (a) 50:200:300, (b) 50:100:300 and (c) 50:50:300, to form contact holes at the layer insulating film of the wafer W. The results achieved in the individual implementation examples are presented in FIG. 2. FIG. 2(A) shows the state at the central area of the wafer W achieved in implementation example 1(a), FIG. 2 (B) shows the state at the edge of the wafer W achieved in implementation example 1(a), FIG. 2(C) shows the state at the central area of the wafer W achieved in implementation example 1(b), FIG. 2(D) shows the state at the edge of the wafer W achieved in implementation example 1(b), FIG. 2(E) shows the state at the central area of the wafer W achieved in implementation example 1(c) and FIG. 2 (F) shows the state at the edge of the wafer W achieved in implementation example 1(c).

As shown in FIG. 2, a bowing X occurs at (a) $CF_4:N_2=$50:200, and therefore, the etching shape is poor. A high selection ratio and a good etching shape are achieved at (b) $CF_4:N_2=$50:100. At (c) $CF_4:N_2=$50:50, the selection ratio is lower than that achieved at (b) and also, an etching stop occurs.

Thus, among these implementation examples, the flow rate ratio (b) $CF_4:N_2=$50:100=1:2 achieves the most desirable results, and by comparing the results at (a)~(c), it can be judged that a higher resist-relative selection ratio and a good etching shape are achieved when the flow rate ratio is set essentially within a range of 1≦($N_2$ flow rate/$CF_4$ flow rate)≦4.

(B) Implementation examples 2 (changes in the flow rate ratio of $C_4F_8$ and $N_2$)

In this implementation example, the processing gas is constituted of a mixed gas containing $C_4F_8$, $N_2$ and Ar and the flow rate ratio of $C_4F_8$ and $N_2$ is varied.

In implementation examples 2(a)–2(b), an etching process is implemented by adjusting the flow rate ratio of $C_4F_8$, $N_2$ and Ar, respectively at (a) 12:200:300 and (b) 12:100:300 to form contact holes at the layer insulating film of the wafer W. The results achieved in the individual implementation examples are presented in FIG. 3. FIG. 3(A) shows the state at the central area of the wafer W achieved in implementation example 2(a), FIG. 3(B) shows the state at the edge of the wafer W achieved in implementation example 2(a), FIG. 3(C) shows the state at the central area of the wafer W achieved in implementation example 2(b) and FIG. 3(D) shows the state at the edge of the wafer W achieved in implementation example 2(b).

As shown in FIG. 3, at the flow rate (a) $C_4F_8$:$N_2$=12:200, a high selection ratio and a good etching shape are achieved, whereas at the flow rate ratio (b) $C_4F_8$:$N_2$=12:100, the selection ratio is lower than that achieved at (a) and also an etching stop occurs.

Thus, among these implementation examples, the flow rate ratio (a) $C_4F_8$:$N_2$=12:200 achieves the most desirable results, and by comparing the results at (a) and (b), it can be judged that a higher selection and a good etching shape are achieved when the flow rate ratio is set essentially within a range of 10≦($N_2$ flow rate/$C_4F_8$ flow rate).

While the invention has been particularly shown and described with respect to preferred embodiments of the etching method according to the present invention by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiments and the implementation examples in which a processing gas achieved by mixing $N_2$, $C_4F_8$ and Ar or a processing gas achieved by mixing $N_2$, $CF_4$ and Ar is utilized, the present invention is not restricted by these particulars. For instance, the present invention may be implemented effectively even when Ar is not contained in the processing gas or when an inert gas other than Ar is added into the processing gas. In other words, the present invention may be adopted successfully as long as the processing gas contains at least $N_2$ and $C_4F_8$ or at least $N_2$ and $CF_4$.

In addition, while an explanation is given above in reference to the embodiments and the implementation examples in which a parallel-plane type etching apparatus is employed, the present invention is not limited by these structural particulars. The present invention may be adopted in any of various types of plasma etching apparatuses including an etching apparatus in which a magnetic field is formed inside the processing chamber, an inductively coupled. etching apparatus provided with an electrostatic shield and a microwave type etching apparatus.

Furthermore, while an explanation is given above in reference to the embodiments and the implementation examples in which contact holes are formed at the layer insulating film formed at the wafer, the present invention is not restricted by these particulars, and it may be adopted to implement any type of etching process on a layer insulating Mm formed at a workpiece.

As explained above, according to the present invention, improvements in the selection ratio and the etching shape are achieved.

The entire disclosure of Japanese Patent Application No. 11-303422 filed on Oct. 26, 1999 including specification, claims, drawings and summary is incorporated herein by reference in its entirety.

What is claimed is:

1. An etching method for etching an organic etching target film, the method comprising:

forming the organic etching target film on a protective film placed inside an airtight processing chamber, the organic etching film containing Si;

introducing a processing gas into the airtight processing chamber, the processing gas containing $CF_4$, $N_2$, and Ar;

generating a plasma in the airtight processing chamber for etching the organic etching target film; and etching the organic etching target film until the protective film is exposed, wherein a resist layer is used as a mask on the organic etching target film, wherein the etching process ceases once the protective film is exposed, wherein the processing gas has a selection ratio greater than approximately 2.0, the selection ratio defined by an etching rate of the organic etching target film divided by an etching rate of the resist layer, and wherein a volume percentage density ratio of $CF_4$, $N_2$, and Ar is within a range: 1:1:6≦vol. % of $CF_4$: vol. % of $N_2$: vol. % of Ar≦1:4:6.

2. The etching method according to claim 1, wherein the organic etching target film is constituted of $SiO_2$ containing C and H.

3. The etching method according to claim 1, wherein a dielectric constant of the organic etching target film is equal to or lower than 3.0.

4. The etching method according to claim 1, wherein the organic etching target film is an organic polysiloxane film.

5. An etching method for etching an organic etching target film, the method comprising:

forming the organic etching target film on a protective film placed inside an airtight processing chamber, the organic etching film containing Si;

introducing a processing gas into the airtight processing chamber, the processing gas containing at least $CF_4$, $N_2$, and Ar;

generating a plasma in the airtight processing chamber for etching the organic etching target film; and etching the organic etching target film until the protective film is exposed, wherein a resist layer is used as a mask on the organic etching target film, wherein the etching process ceases once the protective film is exposed, wherein a flow rate ratio of $CF_4$ and $N_2$ in the processing gas is set within a following range: ($N_2$ flow rate/$CF_4$ flow rate)≧1 to prevent an occurrence of an etching stop and ($N_2$ flow rate/$CF_4$ flow rate)≦4 to prevent an occurrence of bowing, and wherein a volume percentage density ratio of $CF_4$, $N_2$, and Ar is within a range: 1:1:6≦vol. % of $CF_4$: vol. % of $N_2$: vol. % of Ar≦1:4:6.

* * * * *